US009141484B2

(12) United States Patent
Gaertner et al.

(10) Patent No.: US 9,141,484 B2
(45) Date of Patent: Sep. 22, 2015

(54) TRANSIENTLY MAINTAINING ECC

(71) Applicant: Seagate Technology LLC, Cupertino, CA (US)

(72) Inventors: Mark A. Gaertner, Vadnais Heights, MN (US); Kevin Dao, Shakopee, MN (US); Steven Faulhaber, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 125 days.

(21) Appl. No.: 13/843,869

(22) Filed: Mar. 15, 2013

(65) Prior Publication Data

US 2014/0281821 A1 Sep. 18, 2014

(51) Int. Cl.
 G11C 29/00 (2006.01)
 G06F 11/16 (2006.01)
 H03M 13/00 (2006.01)

(52) U.S. Cl.
 CPC ............ *G06F 11/1666* (2013.01); *G11C 29/00* (2013.01); *H03M 13/00* (2013.01)

(58) Field of Classification Search
 CPC .................................................. G06F 11/1666
 USPC ......................................... 714/770, 763, 773
 See application file for complete search history.

(56) References Cited

U.S. PATENT DOCUMENTS

| 5,255,270 | A | 10/1993 | Yanai | |
|---|---|---|---|---|
| 6,173,361 | B1 * | 1/2001 | Taketa | 711/113 |
| 6,192,492 | B1 * | 2/2001 | Masiewicz et al. | 714/56 |
| 6,243,827 | B1 * | 6/2001 | Renner, Jr. | 714/6.12 |
| 6,914,846 | B2 * | 7/2005 | Harari et al. | 365/230.03 |
| 8,140,909 | B2 | 3/2012 | Luan | |
| 8,296,625 | B2 * | 10/2012 | Diggs et al. | 714/762 |
| 8,489,976 | B2 * | 7/2013 | Ikeuchi et al. | 714/801 |
| 8,560,775 | B1 * | 10/2013 | McDuffee et al. | 711/114 |
| 8,825,937 | B2 * | 9/2014 | Atkisson et al. | 711/102 |
| 2005/0005191 | A1 | 1/2005 | Judd | |
| 2006/0179381 | A1 | 8/2006 | Durica | |
| 2006/0294299 | A1 | 12/2006 | Edirisooriya | |
| 2007/0079185 | A1 * | 4/2007 | Totolos, Jr. | 714/718 |
| 2007/0168754 | A1 | 7/2007 | Zohar | |
| 2009/0006757 | A1 * | 1/2009 | Singhal et al. | 711/128 |
| 2009/0172324 | A1 | 7/2009 | Han | |
| 2011/0296122 | A1 * | 12/2011 | Wu et al. | 711/156 |

OTHER PUBLICATIONS

Rollins, A Comparison of Client and Enterprise SSD Data Path Protection, Senior Strategic Applications Engineer Micron Technology, Inc., 2011.
End-to-End Data Path Protection, Smart Storage Systems, Feb. 2012.
Zhao, LDPC-in-SSD: Making Advanced Error Correction Codes Work Effectively in Solid State Drives, ECSE Department, Rensselaer Polytechnic Institute, Department of Computer Science and Engineering, Jan. 2013, The Ohio State University, USA.

* cited by examiner

*Primary Examiner* — Esaw Abraham
(74) *Attorney, Agent, or Firm* — Cesari & Reed LLP; Kirk A. Cesari; David K. Lucente

(57) ABSTRACT

Mass storage uses additional error correction codes. The additional codes can be stored in a storage medium (e.g., volatile solid state memory) separate from the associated data. The additional codes may be written to a nonvolatile medium. The additional codes may be transient. The additional codes may be cached. As long as present, the additional codes may be used to correct user data in synch with or in addition to other error detection and correction codes.

20 Claims, 5 Drawing Sheets

TRANSIENTLY MAINTAINING ECC

SUMMARY

Mass storage uses additional error correction codes. The additional codes can be stored in a storage medium (e.g., volatile solid state memory) separate from the associated data. The additional codes may be written to a nonvolatile medium, may be transient, or may be cached. As long as present, the additional codes may be used to correct user data with or in addition to other error correction codes.

DETAILED DESCRIPTION

Mass storage persistently saves information and has a capacity large enough for the needs of the user or system using it. Mass storage includes systems like tape libraries, RAID and JBOD. Mass storage also includes devices like hard disc drives, magnetic tape drives, optical disc drives, magneto-optical drives and solid-state drives. Mass storage also includes infrastructures that use the mass storage systems or devices. Such infrastructures can be direct attached storage, network attached storage, storage area networks, data storage racks, distributed file systems and the Cloud.

The ability of the mass storage to maintain the integrity of the saved information is a desired characteristic. The use of error correction codes (ECC) provide a way to maintain the information integrity. ECC can then be saved with the information for which it is maintaining the integrity. Saving the ECC this way has costs. One cost is that ECC requires storage space. Either space within the mass storage for saving information is reallocated for saving ECC, or additional external mass storage is provisioned to save the ECC. For the former the mass storage capacity is decreased and for the latter over-provisioning adds expense and complexity. If improved or host write-based ECC is desired, then the mass storage capacity will either be decreased further or additional overprovisioning will be provided. Either case exacerbates the described costs.

The mass storage can maintain the integrity of the saved information by saving a copy of the information. The mass storage then does not have to use ECC information, which will eliminate the associated hardware/firmware. However, the capacity of the mass storage will have to be roughly doubled to save a given amount of information or the capacity will be roughly halved if no overprovisioning is used. Also, complexity is increased by trying to determine which copy is correct. Again, there is a cost to using this scheme to maintain the integrity of the saved information.

In addition, some types of ECC are computed over a set of data. If that set of data is not completely written then there is a significant performance expense related to computing the redundancy since all of the unwritten data needs to be read from the storage medium to compute the new ECC.

Figure 1:
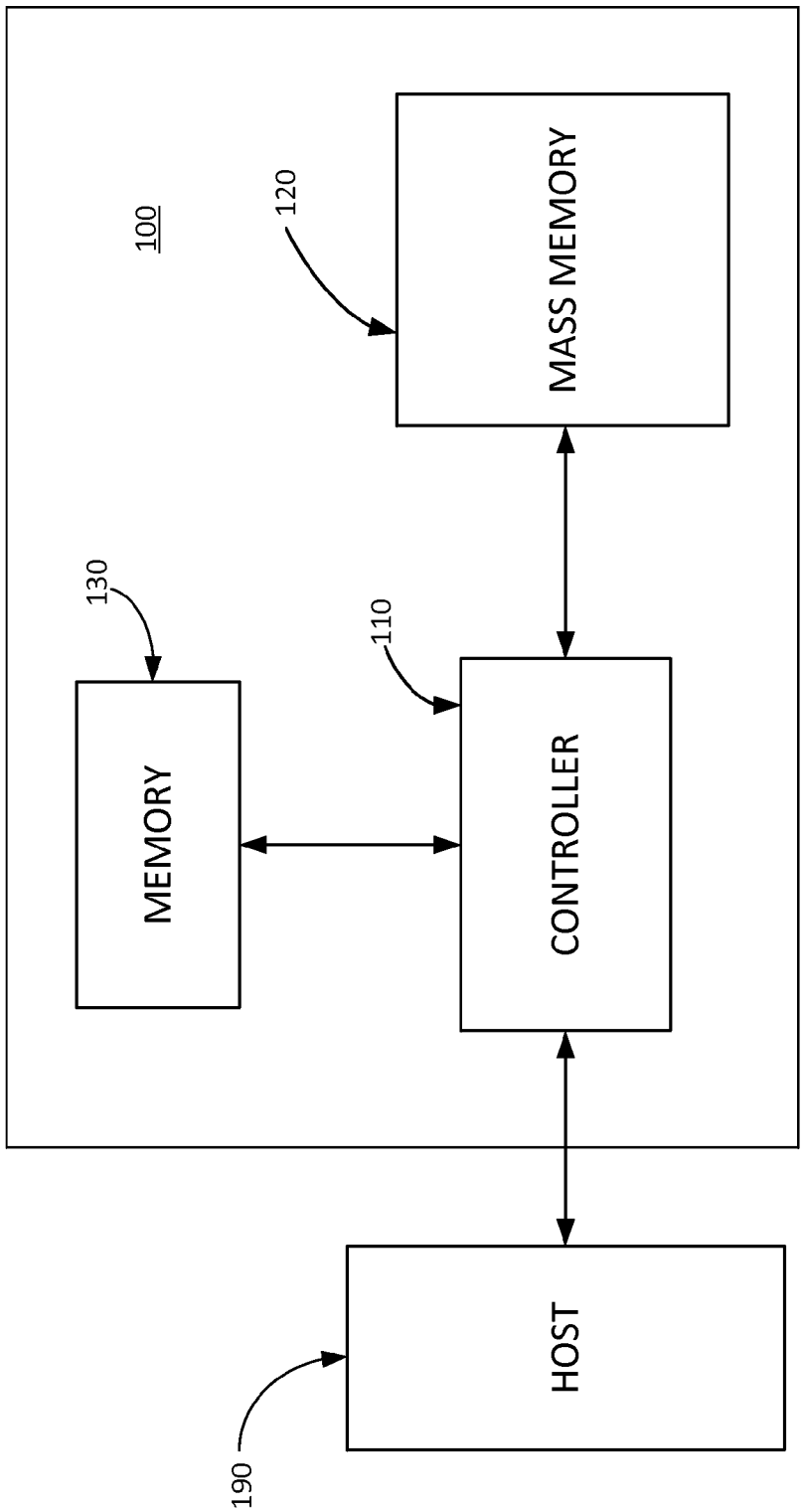
FIG. 1 shows a device using additional error correction codes.

The mass storage can improve the integrity of the saved information by using host write-based ECC, but saving it in memory separate from the memory or the portion of the memory where the saved information resides. This host write-based ECC covers a variable range of memory determined by the data in a single host transfer. In other words, the host write-based ECC does not cover a single unit of mass storage memory (e.g., sector) or a deterministic set of sectors (e.g., RAID parity). Referring to FIG. 1, a mass storage device 100 is shown that includes a controller 110, a mass memory 120 and a memory 130. Mass memory 120 can include at least one magnetic disc, optical disc, magneto-optical disc, tape, solid-state memory or holographic memory, or a combination of at least two of them. Memory 130 can include volatile or non-volatile memory such as DRAM, SRAM, flash or battery-backed-up volatile memory. Controller 110 can use memory 130 as a cache for information to be written to mass memory 120.

Host 190 is coupled to mass storage device 100. Host 190 interacts with mass storage device 100 by using a data transfer protocol like SCSI, SAS, various SATA (e.g., mSATA, eSATA), Fibre Channel, etc. Host 190 writes information to mass storage device 100 where it is received by controller 110 and buffered or cached in memory 130. Mass storage device 100 can then save the information to mass memory 120. Mass storage device 100 can generate host write-based ECC when the information from the host is being transferred to or from memory 130. Host write-based ECC can also be generated any time while the information is in memory 130, for example prior to eviction from memory 130. The host write-based ECC includes any error correction code such as Reed-Solomon, Hamming, BCH, Convolution, Turbo, simple parity and LDPC. The host write-based ECC can include any error detection code such as parity, checksum and cyclic redundancy check.

The host write-based ECC resides in memory 130. There it can be used in a variety of ways before it is deleted, released or evicted. The host write-based ECC can be used to ensure the integrity of the saved information for user or system read operations. The host write-based ECC can also be used to ensure the integrity of the saved information during internal reliability operations of the mass storage device 100 such as background media scans, parity generation on a stripe or any other deterministic set of LBAs, and read-after-write verification. host write-based ECC The host write-based ECC can be maintained in or deleted, released or evicted from memory 130 based on the occurrence of one of several criteria. If memory 130 is controlled by cache eviction policies, then the criteria for evicting the host write-based ECC can be responsive to least recently used (LRU), least frequently used (LFU), FIFO, set associative, etc. Furthermore, when host write-based ECC is generated the cache policy can be altered to take into account the maintenance and release of the host write-based ECC. The host write-based ECC can be maintained in, deleted, released or evicted from memory 130 based on a priority for certain address ranges, such as frequently written addresses or error-prone addresses. Also, a pending eviction of the host write-based ECC can be used to prioritize the internal reliability operations. Furthermore, the host write-based ECC can be deleted, released or evicted after it is used for internal reliability operations. And an eviction of the host write-based ECC from mass memory 120 can be either allowed prior to guaranteeing its use as described above or not allowed until it is used as described above.

The host write-based ECC can be written to nonvolatile memory in several ways. In FIG. 1, the host write-based ECC can be written to mass memory 120 instead of memory 130. For example, mass memory 120 can be a magnetic disc that has a media cache to which the host write-based ECC is maintained. Alternatively, the host write-based ECC can be written to mass memory 120 after it is written to memory 130. In this case, the writing of the host write-based ECC to mass memory 120 can occur prior to evicting it from memory 130 or when a power loss occurs in mass storage device 100. For the case of the power loss, memory 130 can be provided power by, for instance, the back EMF of the spindle motor so that the host write-based ECC can be written into mass memory 120.

The additional ECC can be maintained in or deleted, released or evicted from the mass memory 120 using the same criteria described above for memory 130. The host write-based ECC in mass memory 120 can also be used as described above for memory 130. In addition, an eviction of the host write-based ECC from mass memory 120 can be either allowed prior to guaranteeing its use as described above or not allowed until it is used as described above.

The host write-based ECC can also have associated metadata. Metadata refers to data that describes the host write-based ECC. Metadata can include the LBA range the host write-based ECC covers, pointers to the location of the host write-based ECC, a link to the next oldest host write-based ECC, a link to the next youngest host write-based ECC, a link to the host write-based ECC covering the next higher LBA range, and a link to the host write-based ECC covering the next lower LBA range. For each host write-based ECC, the metadata may track the corresponding LBA range. For example, assume logical block addresses 100-109 are transferred either from the host or between memories and host write-based ECC is generated. The metadata records that the host write-based ECC exists for those logical block addresses and the location of that host write-based ECC (e.g. DRAM address). There also may be different types or configurations of host write-based ECC. If so, that would also be described by the metadata. This metadata also can be stored in nonvolatile memory such as mass memory 120 so the host write-based ECC is preserved across expected and unexpected power cycles.

Memory 130 can also maintain a valid set of metadata by tracking the host write-based ECC that overlaps pre-existing host write-based ECC. To continue with the above example, if another write is received for logical block addresses 100-109 (or some other overlapping scenario), the pre-existing host write-based ECC is now invalid since it covers over-written data. Therefore, the metadata should be appropriately managed to indicate the host write-based ECC for the over-written data is invalid and should be updated to describe the new host write-based ECC, if any.

Figure 2:
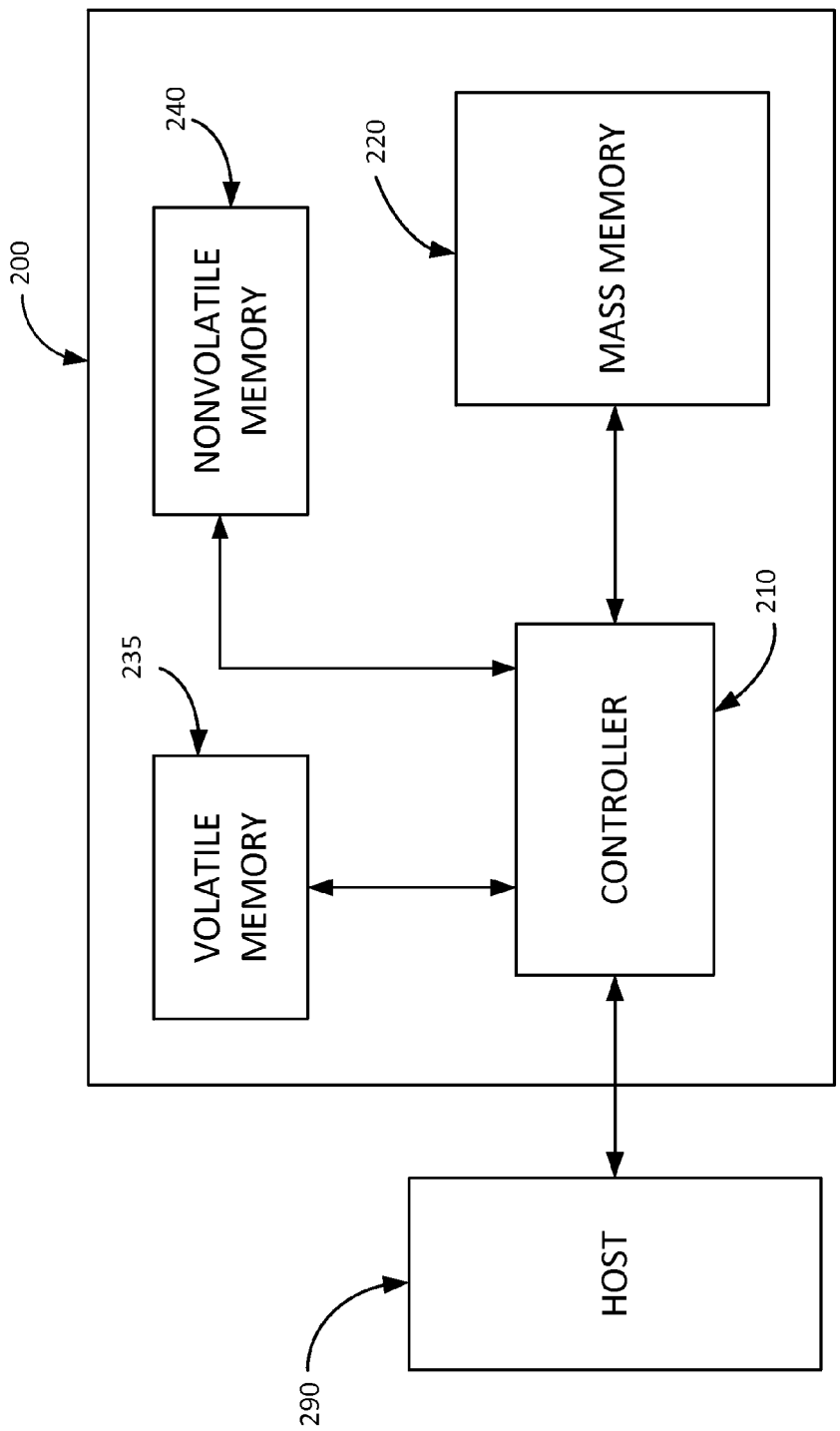
FIG. 2 shows another device using additional error correction codes.

FIG. 2 shows a mass storage device 200 that uses host write-based ECC. A controller 210, mass memory 220, volatile memory 235 and nonvolatile memory 240 are included in mass storage device 200. Mass memory 220 can include at least one magnetic disc, optical disc, magneto-optical disc, tape, solid-state memory or holographic memory, or a combination of at least two of them. Memory 235 can include volatile memory such as DRAM and SRAM. Nonvolatile memory 240 can include nonvolatile solid-state memory such as FLASH, STRAM, ReRAM, MRAM, etc. Host 290 is coupled to mass storage device 200.

Mass storage device 200 can save the host write-based ECC in one, two or all three of the memories shown. For example, a tiered storage can be used where the host write-based ECC is first saved in volatile memory 235, then saved to nonvolatile memory 240, then saved to mass memory 220. The movement of the host write-based ECC among these memories can be based on the eviction criteria described above. Other permutations for these memories are possible. The host write-based ECC can be written to volatile memory 235, then written to nonvolatile memory 240 based on any of the ways described above for mass storage device 100 of FIG. 1. The maintenance, release, deletion, eviction and use of the host write-based ECC can be the same as described above for mass storage device 100.

Figure 3:
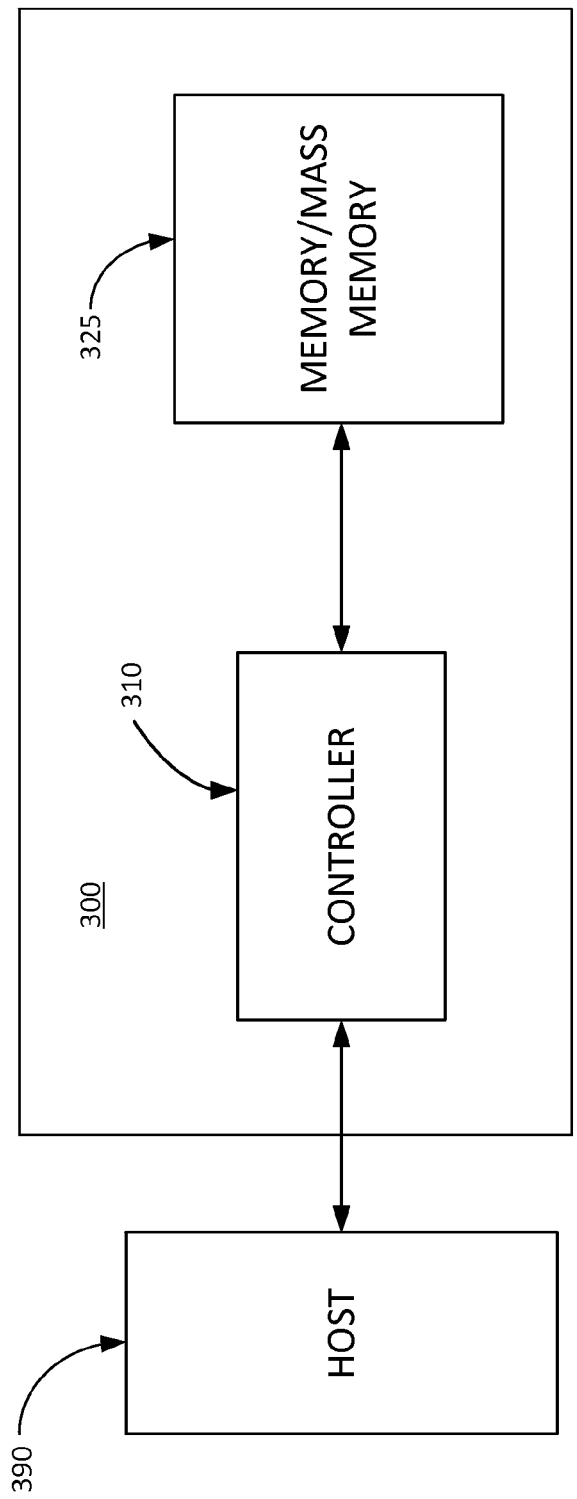
FIG. 3 shows a further device using additional error correction codes.

FIG. 3 shows a host 390 coupled to a mass storage device 300 that includes controller 310 and memory/mass memory 325. Memory/mass memory 325 can be a homogenous storage medium, such as flash memory or a magnetic disc. This kind of storage medium can be used as both a memory for storing the host write-based ECC and a mass memory for saving associated information. If flash memory is used, the memory portion of memory/mass memory 325 can be SLC and the mass memory portion can be MLC. Another option would be the LSB pages of a MLC device. LSB pages typically program much faster than the MSB pages. If a magnetic disc is used, the memory portion is a media cache and the mass memory portion can be the remaining surface of the disc. In either case, the memory portion exhibits faster read or write speeds (or both) than the mass memory portion. The maintenance, release, deletion, eviction and use of the host write-based ECC can be the same as described above for mass storage device 100.

Figure 4:
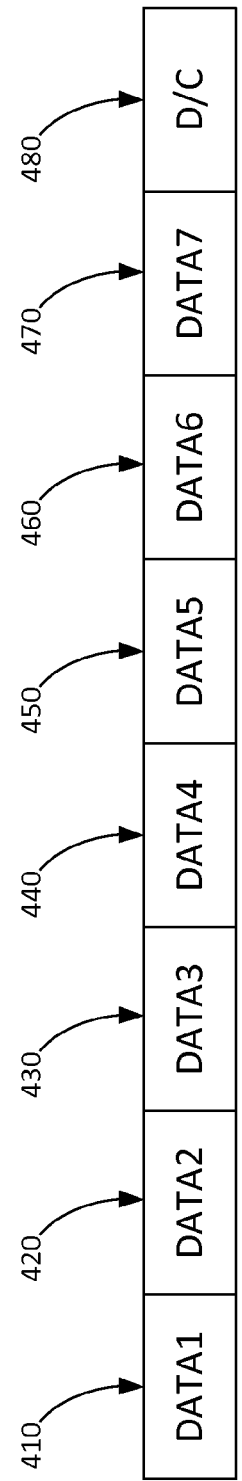
FIG. 4 shows data that can use additional error correction codes.

The application of the host write-based ECC so described will be explained with reference to FIG. 4. In FIG. 4 are DATA blocks 410-470 and correction code (ECC) block 480. Each of DATA blocks 410-470 can include its own error detection or correction information (or both). ECC block 480 is used for all of DATA blocks 410-470. Blocks 410-480 can be contiguous on a track of a magnetic disc, blocks in a flash memory or a stripe of a RAID system where each block 410-480 is stored on a different mass storage device.

A host coupled to, for instance, mass storage device 100 of FIG. 1 can request to write information to DATA blocks 430-440. The associated host write-based ECC is generated for DATA blocks 430-440 as described above and saved in memory, such as memory 130. The EDC block 480 is now invalid since part of the data it protects has been newly written. The mass storage device 100 can perform an internal reliability operation like a background media scan. Also, the ECC block 480 is now invalid since part of the data it protects has been newly written. The ECC generated for blocks 430-440 can be used to update EDCECC block 480.

If an error is found in DATA block 430, mass storage device can use the associated host write-based ECC to correct the error in conjunction with, in addition to or as an alternative to either the error detection or correction (or both) information in DATA block 430 or ECC block 480 if it has been updated.

Figure 5:
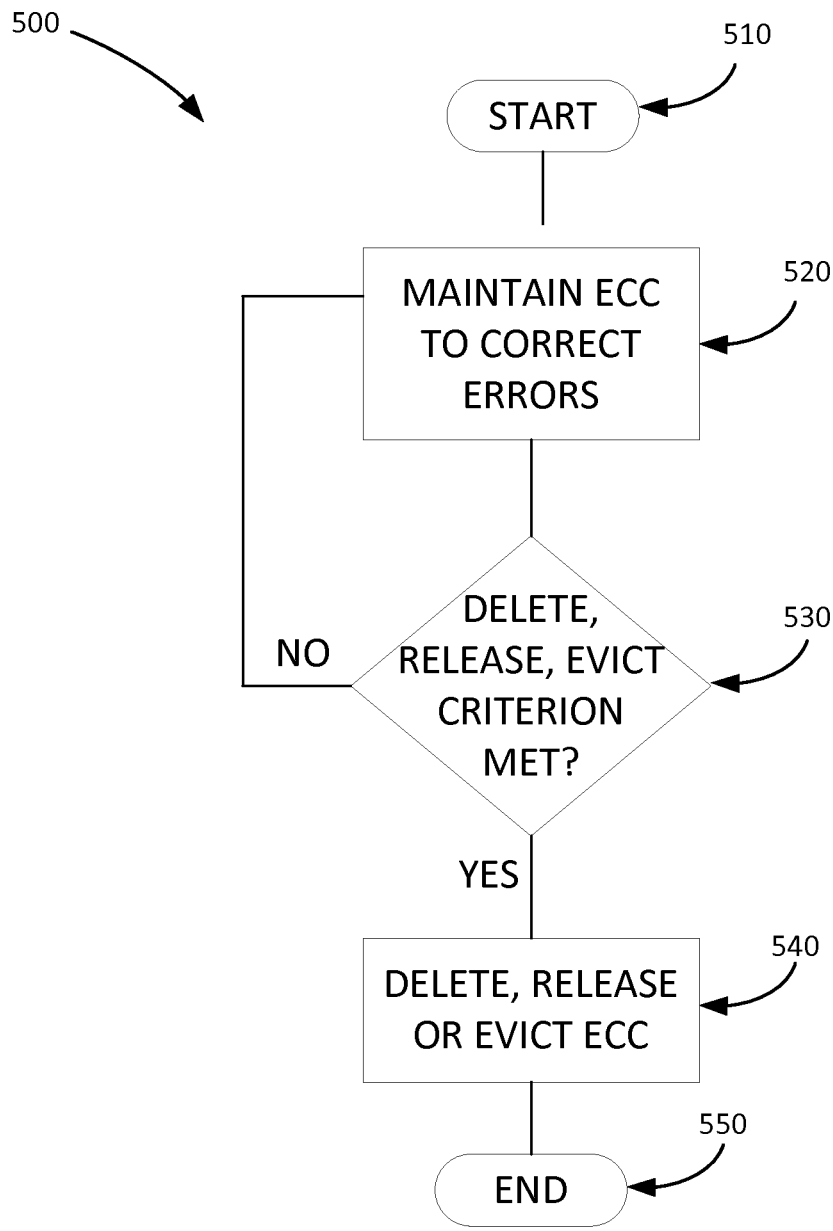
FIG. 5 is a flow chart of a method of using additional error correction codes.

FIG. 5 shows a method 500 related to the host write-based ECC described. Method 500 starts at step 510, then proceeds to step 520 where a mass storage maintains the host write-based ECC to correct information errors. At step 530 a determination is made if an eviction, release or deletion criterion is met. If not, the method returns to step 520. If yes, the method proceeds to step 540 where the host write-based ECC is evicted. Method 500 then ends at step 550.

In any of the mass storage described above, the host write-based ECC can be evicted, released or deleted before the associated information is overwritten, erased or released. Then the host write-based ECC is transient relative to the associated information. For instance, a mass storage can use the host write-based ECC to generate parity such as EDC block 480. Then the host write-based ECC can be evicted from the memory. This is an example of a single-use transiency. As another instance, the host write-based ECC can be used as described above until it is evicted, released or deleted. This is an example of a non-single-use transiency.

As further explanation, parity/redundancy computations can be performed on a parity stripe (i.e. RAID group) and saved in address location coupled with that parity stripe. The mass storage described above computes the host write-based ECC without requiring any knowledge of the content of a parity stripe or even without the existence of underlying parity stripes. The host write-based ECC is maintained, sometimes transiently, on recently written data and not necessarily on the entire data set (e.g., parity stripe).

Figure 6:
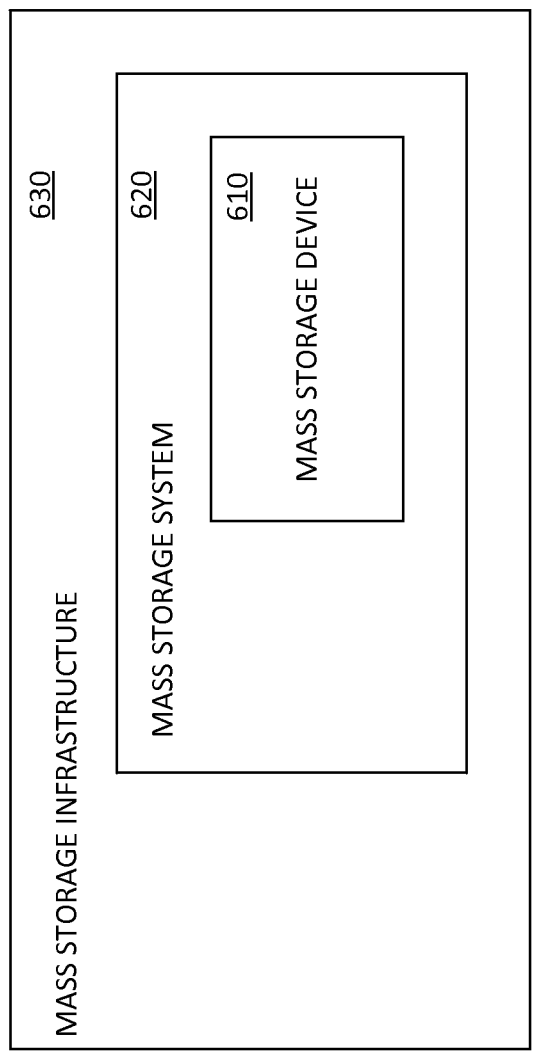
FIG. 6 shows a hierarchy of mass storage that uses additional error correction codes.

FIG. 6 shows a hierarchy of mass storage that uses the host write-based ECC as described above. Here the host write-based ECC can be stored in memory of the mass storage device, system or infrastructure. Regardless of where the additional ECC and saved information resides, the mass storage device, system or infrastructure can retrieve both the information and host write-based ECC and use it as described above. For example, mass storage system 620 can maintain the host write-based ECC in its memory, then write the associated information to mass storage device 610. Mass storage system 620 can later request a read of the associated information from mass storage device 610. Once mass storage system 620 receives the associated information, it can use the host write-based ECC with the associated information as described above.

As another example, mass storage system 620 can maintain the host write-based ECC in its memory, then write the associated information to mass storage device 610. Mass storage device 610 can later request the host write-based ECC from mass storage system 620 and used it as described above. Similar interactions can occur with mass storage infrastructure 630.

The methods and apparatus described above can use the host write-based ECC to recover data from written-in errors that may not have produced a detectable fault or any other error on recently written data. The controller alone or with associated firmware controls the maintenance of the host write-based ECC in the memory or memories.

The above description sets out details, but should not be taken as limiting the scope of the claims. Various modifications of, deletions from and additions to the above description are within the scope of the claims.

What is claimed is:

1. A method comprising:
   maintaining host write-based ECC in a memory; and
   evicting the host write-based ECC from the memory responsive to a caching policy,
   wherein the host write-based ECC improves maintenance of integrity of saved information.

2. The method of claim 1 wherein the caching policy is a one of least recently used (LRU), least frequently used (LFU), first in first out (FIFO) and set associative.

3. The method of claim 1 further comprising using the host write-based ECC for an internal reliability operation.

4. The method of claim 3 wherein the internal reliability operation is one of a background media scan, parity generation, or a read-after-write verification.

5. The method of claim 1 wherein the maintaining includes caching the host write-based ECC.

6. The method of claim 1 further comprising transiently using the host write-based ECC.

7. The method of claim 6 wherein the transiently using is a non-single-use.

8. The method of claim 6 wherein the transiently using is a single use.

9. The method of claim 1 further comprising using the host write-based ECC at least one of in conjunction with, in addition to and as an alternative to other ECC.

10. A method comprising:
    computing host write-based ECC in a storage device; and
    transiently maintaining the host write-based ECC in a volatile memory of the storage device, the host write-based ECC improves maintenance of integrity of saved information in the storage device.

11. The method of claim 10, in which the transiently maintaining of the host write-based ECC uses a caching policy.

12. The method of claim 11, in which the cache policy is an eviction policy that is altered based upon whether host write-based ECC has been generated.

13. The method in claim 10, further comprising writing the host write-based ECC and corresponding metadata to non-volatile memory.

14. The method of claim 10, in which transient maintaining the host write-based ECC is prioritized for certain address ranges.

15. The method of claim 10, further comprising using the host write-based ECC for at least one of recovering data for user reads and recovering data during an internal operation.

16. The method of claim 13, wherein transiently maintaining is non-single use.

17. Mass storage comprising:
    a first memory;
    a second memory for data storage; and
    a controller coupled to the first memory and the second memory, and configured to transiently maintain in the first memory, relative to the data storage, host write-based ECC associated with the data storage.

18. The mass storage of claim 17, wherein the first memory is volatile and the second memory is nonvolatile.

19. The mass storage of claim 17, wherein the controller uses a caching policy to transiently maintain the host write-based ECC.

20. The mass storage of claim 17, wherein the host write-based ECC is one of released, deleted and evicted prior to associated data being one of released, deleted and evicted.

* * * * *